US006284307B1

(12) United States Patent
Fukuzawa et al.

(10) Patent No.: US 6,284,307 B1
(45) Date of Patent: Sep. 4, 2001

(54) COLOR ORGANIC EL DISPLAY AND FABRICATION METHOD THEREOF

(75) Inventors: Shinichi Fukuzawa; Shigeyoshi Otsuki, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/334,093

(22) Filed: Jun. 16, 1999

(30) Foreign Application Priority Data

Jun. 18, 1998 (JP) .................................................. 10-171320

(51) Int. Cl.[7] ................................ B05D 5/06; B05D 5/12
(52) U.S. Cl. ............................. 427/66; 427/68; 427/596; 430/200; 156/232; 156/234; 156/237
(58) Field of Search ................................ 427/596, 66, 68; 156/232, 234, 237; 430/200, 201

(56) References Cited

U.S. PATENT DOCUMENTS 5,688,551 * 11/1997 Littman et al. ........................ 427/64
5,714,301 * 2/1998 Boroson et al. ...................... 430/201

FOREIGN PATENT DOCUMENTS 2-176707   7/1990  (JP) .

* cited by examiner

*Primary Examiner*—Shrive P. Beck
*Assistant Examiner*—Michael Cleveland (57) ABSTRACT

A positive hole transporting layer (14) is formed on an ITO film so as to form a substrate (10). A light emission organic material (20) is formed on the front surface of a convex protrusion portion (18) of a metal sheet (16). The front surface of the positive hole transporting layer (14) and the convex protrusion portion (18) are clamped with a glass plate (22). Laser light is radiated to the interior of the convex protrusion portion (18) through a shielding plate with an opening portion whose size corresponds to the size of the convex protrusion portion (18). The light emission organic material formed on the front surface of the convex protrusion portion (18) sublimates and transfers to the positive hole transporting layer (14). These steps are performed for areas of three color light emission devices.

8 Claims, 10 Drawing Sheets

COLOR ORGANIC EL DISPLAY AND FABRICATION METHOD THEREOF

BACKGROUND OF THE INVENTION

1. Field of the Invention

The present invention relates to a color organic EL display using electroluminescence of an organic compound material and to a fabrication method thereof.

2. Description of the Related Art

In a conventional organic electroluminescence display apparatus using a color organic EL display, it is important to selectively form color light emission organic materials as color light emission devices in a fine pattern on a transparent electrode.

Figure 1:
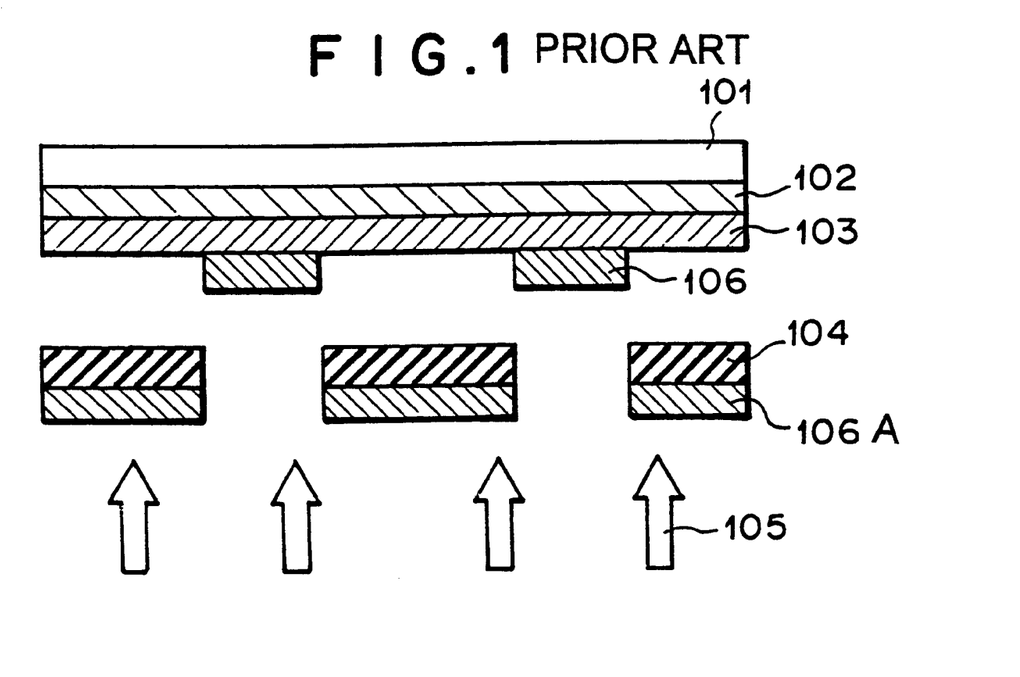
FIG. 1 is a sectional view for explaining a conventional fabrication method for an organic EL display.

In providing such color emission devices on a transparent electrode a shadow mask method has been used in which, when a light emission organic material is selectively evaporated and formed as layer, an opening portion of a shadow mask is formed in a metal sheet (see FIG. 1). In FIG. 1, a transparent anode 102 is disposed below a transparent glass substrate 101. An organic fluorescent film and an organic positive hole transporting layer 103 are disposed below the anode 102. A metal cathode 106 that is selectively evaporated is disposed below the organic positive hole transporting layer 103. A metal sheet 104 as a shadow mask is disposed below the cathode 106 through a small space. An evaporation film 106A is disposed below the metal sheet 104. In addition, an evaporation material 105 is upwardly evaporated. Thus, the metal cathode 106 that is selectively evaporated and the evaporation film 106A that is layered on the metal sheet 104 as the shadow mask are represented as remaining portions. The anode 102 and the cathode 106 are selectively disposed in the shape of lines and columns. A scanning voltage for generating an image is applied to the anode 102 and the cathode 106.

However, in such a method, it is difficult to finely form a metal sheet corresponding to a fine light emission device area and accurately form an evaporation film to a light emission device area because of bend and expansion of a metal sheet. In addition, when the metal sheet contacts the positive hole transporting layer, the element portion breaks and thereby the light emission device becomes large and deteriorates accuracy. Thus, the resolution of the resultant display deteriorates. Moreover, since some light emitting devices do not light, the visual recognition characteristic lowers. Furthermore, the fabrication yield decreases. Thus, the conventional method is not sufficient for the visual recognition characteristic and fabrication yield. In other words, it is not suitable to use the shadow mask method of which an opening portion is formed in a metal sheet.

To solve such a problem, Japanese Patent Laid-Open Publication No. 2-176707 discloses a fabrication method for a color filter array device having a heated emboss surface. In the fabrication method, a plurality of dopant materials composed of sublimation coloring matters with different colors and respective acceptor devices composed of supporting members having coloring matter acceptor layers are used. The dopant materials are successively contacted with the acceptor devices. The dopant materials are contacted with heated emboss surfaces so that the dopant materials are heated in a pattern shape. Thus, the coloring matters are transferred to the acceptor layers. Consequently, an array of repetitive mosaic patterned coloring agents held on supporting members is fabricated.

However, since a metal sheet has a high heat conductivity, the heating roller heats the entire surface of the emboss surface of the sheet, sublimation materials, sublimate and transfer to other than the emboss surface. Thus, the dopant materials contaminate the acceptor elements. Consequently, color purity deteriorates.

In addition, since heat transfers in the state that the heating roller contacts the emboss metal, the contact surfaces should be highly accurate. Thus, the fabrication yield deteriorates. Moreover, since the heating temperature of the sublimation materials should be precisely controlled, the heating method using a heating roller causes the materials to unevenly sublimate.

Thus, when the related art reference disclosed in Japanese Patent Laid-Open Publication No. 2-176707 is applied to a color organic EL display, the colors of light emission devices fluctuate and some devices do not light.

SUMMARY OF THE INVENTION

An object of the present invention is to provide a fabrication method for a color organic EL display free of mutual contaminations of color light emission organic materials in electroluminescence light emission device areas that have been accurately selected.

Another object of the present invention is to provide a fabrication method for a color organic EL display using laser light for heating particular areas so as to constantly sublimate color light emission organic materials.

A first aspect of the present invention is a fabrication method for a color organic EL display having a pair of electrodes and an organic light emission material, at least one of the electrodes being transparent or semi-transparent., the electrodes being oppositely disposed, the method comprising the steps of (a) preparing a transfer substrate having a convex protrusion with high heat conductivity, the light emission organic material being evaporated as a layer on the convex protrusion, (b) clamping the transfer substrate to a positive hole transporting layer formed on a transparent conductive substrate or a transparent conductive film, and (c) heating the convex protrusion of the transfer substrate.

A second aspect of the present invention is a fabrication method for a color organic EL display having an organic light emission material as a layer, comprising the steps of (a) layering a first electrode as a positive hole transporting layer to a glass substrate so as to form a first substrate, (b) layering a metal sheet having a protrusion portion whose edge is flat and which is hollow and layering an organic light emission material thereto so as to form a second substrate, (c) clamping the positive hole transporting layer of the first substrate and the organic light emission material of the second substrate, and (d) radiating laser light from the glass plate of the second substrate so as to raise the temperature of the protrusion portion and transferring the organic light emission material to the first substrate.

In addition, according to the present invention, since a protrusion portion is heated with laser light, fine light emission device areas can be selectively heated. Thus, a color organic EL display with three colors of light emissions has high visual recognition characteristic and a high angle of view field.

Thus, a transfer substrate having a protrusion on which a light emission organic material is evaporated and that has high heat conductivity is disposed. The protrusion causes the light emission organic material to selectively sublimate and transfer to a light emission device area.

Thus, the color purity due to mutual contamination of three color light emission organic materials can be prevented from deteriorating.

While the front surface of a protrusion and the front surface of a positive hole transporting layer are being clamped, laser light as a heating source is radiated to the interior of the protrusion and thereby the light emission organic material on the front surface of the protrusion is heated. Thus, the light emission organic material sublimates and transfers to the front surface of the positive hole transporting layer.

Thus, since laser light is radiated to only the front surface of the protrusion, a temperature slope takes place between the radiated portion and the non-radiated portion. Thus, since the light emission organic material does not sublimate, it does not contaminate to other light emission devices. Consequently, the color purity improves.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described.

[First Embodiment]

Figure 2A:
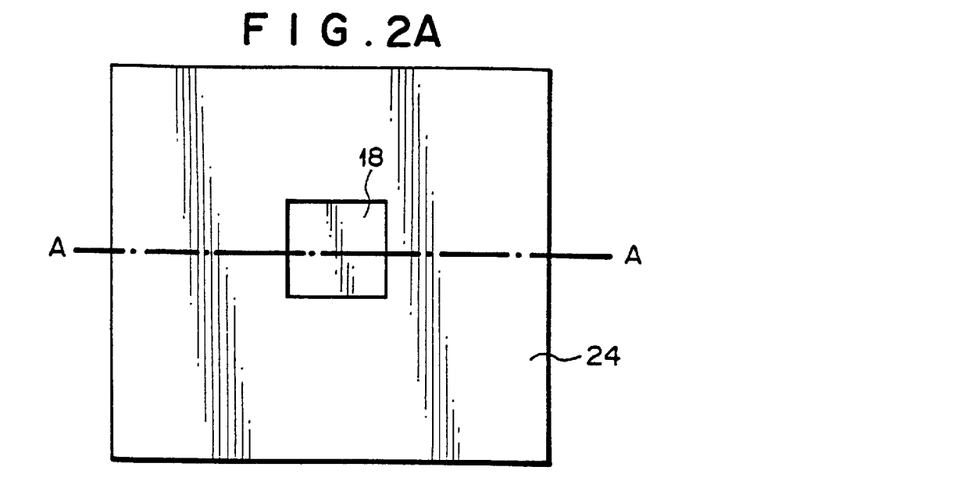
FIG. 2A is a plan view for explaining a fabrication method for a color organic EL display according to a first embodiment of the present invention.
Figure 2B:
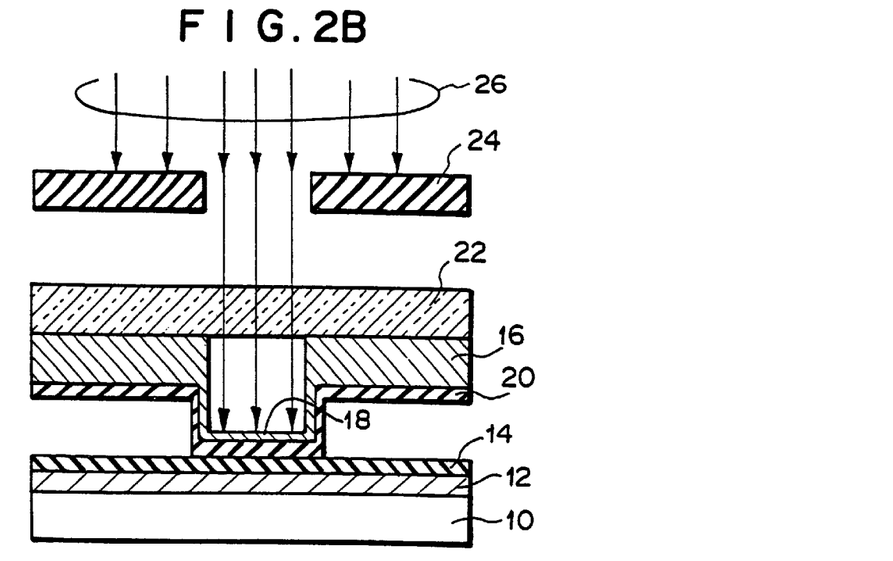
FIGS. 2B and 2C are sectional views of FIG. 2A.
Figure 2C:
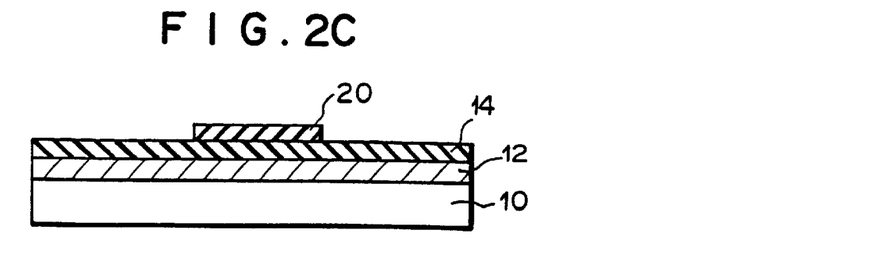

FIG. 2A is a plan view for explaining a fabrication method for a color organic EL display using a light emission organic material 20 that is sublimated and transferred according to a first embodiment of the present invention. FIG. 2B is a sectional view taken along line A—A of FIG. 2B. FIG. 2C is a sectional view showing the color organic EL display that has been fabricated according to the first embodiment of the present invention.

On a glass substrate 10 that becomes the front surface of the display, an ITO film 12 that is a transparent conductor film and a positive hole transporting layer 14 are formed. In FIG. 2B, a transfer substrate has a protrusion portion 18 disposed on a metal sheet 16. The shape of the protrusion portion 18 corresponds to the shape of a light emission device area. The height of the protrusion portion 18 is 50 $\mu$m or less. The thickness of the protrusion portion 18 is around 10 $\mu$m in consideration of the heat conductivity. In this state, the light emission organic material 20 is vacuum evaporated on the metal sheet 16. On the metal sheet 16, a glass plate 22 that is transparent and transmits visible light is disposed. The load of the glass plate 22 is applied to the glass substrate 10.

Laser light 26 is radiated to the entire surface of the light emission device area of the glass substrate 10 through a shielding plate 24 having an opening portion whose size corresponds to the size of the light emitting device area.

Since the laser light 26 straightly travels, it does not scatter at the opening portion of the shielding plate 24. Instead, the laser light 26 radiates only the interior of the protrusion portion 18. At the radiated portion, the laser light 26 is converted into heat. Thus, the light emission organic material 20 on the front surface of the protrusion portion 18 sublimates. Consequently, the light emission organic material 20 transfers to the front surface of the positive hole transporting layer 14, which contacts the protrusion portion 18.

Due to a heat slope, the temperature of the interior side wall of the protrusion portion 18 is lower than the temperature of the radiated portion of the laser light 26. Thus, in the interior side wall, the light emission organic material 20 is suppressed from sublimating.

Consequently, the light emission organic material 20 and adjacent color light emission organic material (not shown) are prevented from mutually contaminating.

In the fabrication method according to the first embodiment, the color organic EL display is fabricated as shown in FIGS. 2A, 2B, and 2C. In other words, an ITO film 12 that is a transparent conductive film is formed for 120 nm. Thereafter, a positive hole transporting layer 14 is equally vacuum-evaporated for 50 nm on the ITO film 12 (see FIG. 2B). The positive hole transporting layer 14 is composed of N, N'-diphenyl-N, N'-di(3-methylphenyl)-1,1'-biphenyl-4,4'-diamine.

A metal sheet 16 that becomes a transfer substrate is composed of a copper plate with a thickness of 200 $\mu$m. On the metal sheet 16, a protrusion portion 18 is photo-lithographed and etched in a plate shape whose size is 100 $\mu$m×100 $\mu$m and whose thickness is 200 $\mu$m. Thereafter, the rear surface of the protrusion portion 18 is photo-lithographed and etched so that the inner thickness thereof becomes 10 $\mu$m. As the light emission organic material 20 that emits red light, alumiquinoline complex and 4-dicyanomethylene-2-methyl-6-(p-dimethylaminostyryl)-4H-pyrane as a dopant are co-evaporated for 25 mn. In addition, two layers of alumiquinoline complex as the electron transporting layer 20 are evaporated for 35 nm. After the front surface of the ITO 12 that becomes the light emitting device area on the substrate 10 is aligned with the protrusion portion 18 of the metal sheet 16, they are contacted. Thereafter, a glass plate 22 is placed on the metal sheet 16 so that the protrusion portion 18 and the substrate 10 are clamped.

Thereafter, the shielding plate 24 having an opening portion whose size is 80 $\mu$m×80 $\mu$m is aligned with the protrusion portion 18. Laser light 26 with a wavelength of 1000 nm is radiated from a YAG laser source to the entire surface of the shielding plate 24. The laser radiation is stopped when the temperature of the protrusion portion 18 becomes 500° C. Thus, the light emission organic material 20 on the protrusion portion 18 sublimates and transfers to the front surface of the positive hole transporting layer 14 (see FIG. 2C).

In the fabrication method according to the first embodiment, laser light is selectively radiated to the rear surface of the supporting member on which the light emission organic material 20 is evaporated. The radiated portion heats and thereby the light emission organic material 20 on the supporting member sublimates. Thus, the light emission organic material 20 does not blur. Consequently, since the temperature control is stably performed, the thermal distribution can be controlled.

[Second Embodiment]

Figure 3A:
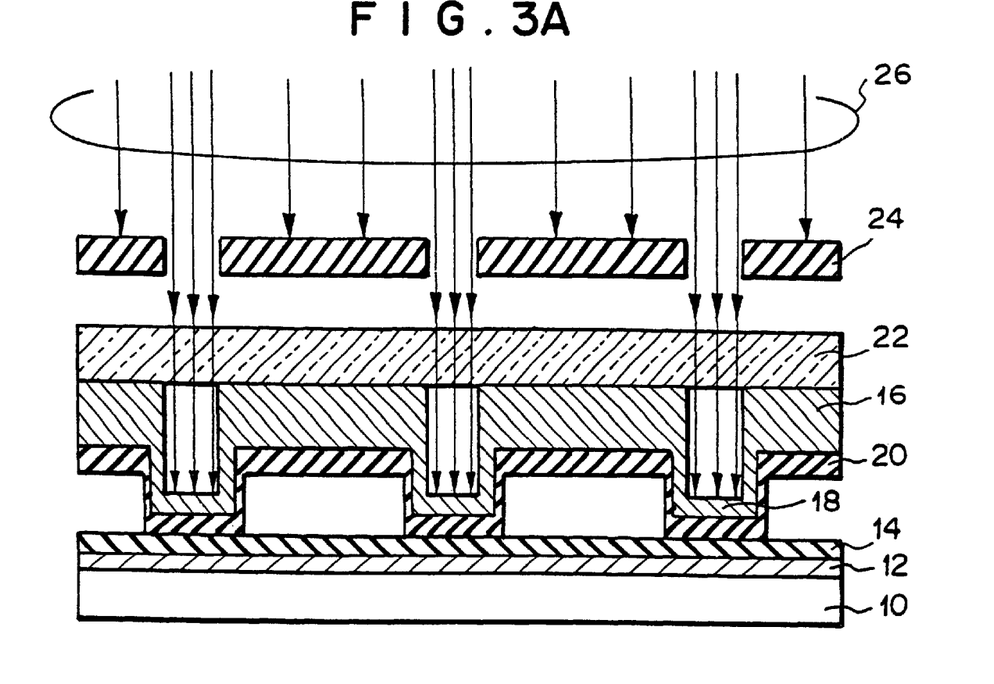
FIGS. 3A, 3B, and 3C are sectional views for explaining a fabrication method for a color organic EL display according to a second embodiment of the present invention.
Figure 3B:
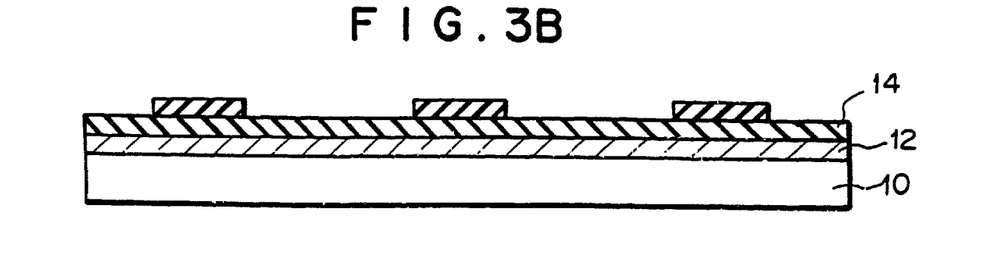
Figure 3C:
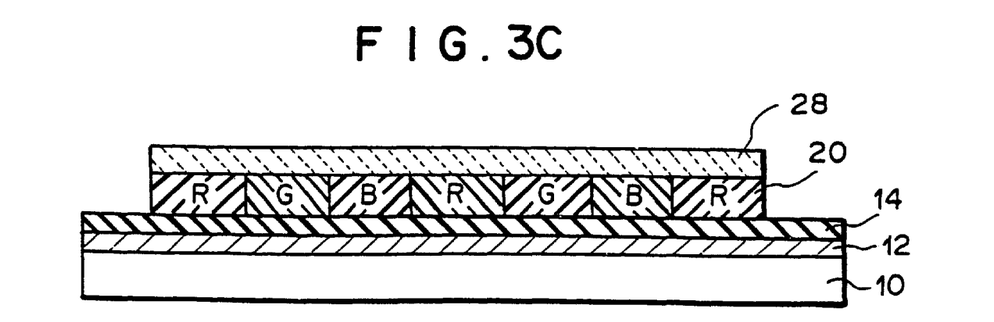

Next, with reference to FIGS. 3A, 3B, and 3C, a fabrication method for a color display according to a second embodiment of the present invention will be described.

The steps until the positive hole transporting layer 14 in the second embodiment is formed are the same as those in the first embodiment.

A protrusion portion 18 of a metal sheet 16 is formed with a size of 100 $\mu$m×100 $\mu$m and with a color arrangement pitch of 300 $\mu$m. The height of the protrusion portion 18 is 50 $\mu$m. The inner thickness of the protrusion portion 18 is 10 $\mu$m. As a red light emission organic material, alumiquinoline complex and 4-dicyanomethylene-2-methyl-6-(p-dimethylaminostyryl)-4H-pyrane (DCM, doping concentration=5 wt %) as a dopant are co-evaporated for 25 nm. As an electron conveying layer, alumiquinoline complex is evaporated for 35 nm. After a light emission element portion is aligned with the protrusion portion 18, a glass plate 22 is placed on the metal sheet 16. Laser light with a wavelength of 1000 nm is radiated from a YAG laser source to the interior of the protrusion portion 18 through a shielding plate 24. Thus, the red light emission organic material sublimates and transfers to the positive hole transporting layer 14 (see FIG. 3A).

As a green light emission organic material, tris (8-quinolinole) aluminum (alumiquinoline complex) as a host and qunacridone (doping concentration=5 wt %) as a dopant are co-evaporated for 25 mn on a protrusion portion 18 of a respective metal sheet 16. As an electron transporting layer, tris (8-quinolinole) aluminum is evaporated for 30 nm. The green light emission organic material is aligned with the red light emission organic material The glass plate 22 is placed on the metal sheet 16. Laser light is radiated to the interior of the protrusion portion 18. In the same manner as the red light emission organic material, the green light emission organic material sublimates and transfers to the green light emission device area.

As a blue light emission organic material, perylene is evaporated for 25 nm on a protrusion portion 18 of a respective metal sheet 16. As an electron transporting layer, tris (8-quinolinole) aluminum is evaporated for 35 nm. In the same manner as the red light emission organic material, the blue light emission organic material sublimates and transfers to a blue light emission device area. Thus, a light emission element array of three colors is obtained.

Next, as a cathode, AL:Li films 28 are co-evaporated for 30 nm so that they are perpendicular to the ITO film 14 and the light emission device areas. Thereafter, aluminum is evaporated for 100 nm Thus, a color organic EL display is obtained (see FIG. 3C).

[Third Embodiment]

Next, a third embodiment of the present invention will be described. In the third embodiment, the contrast between devices is improved.

Figure 4A:
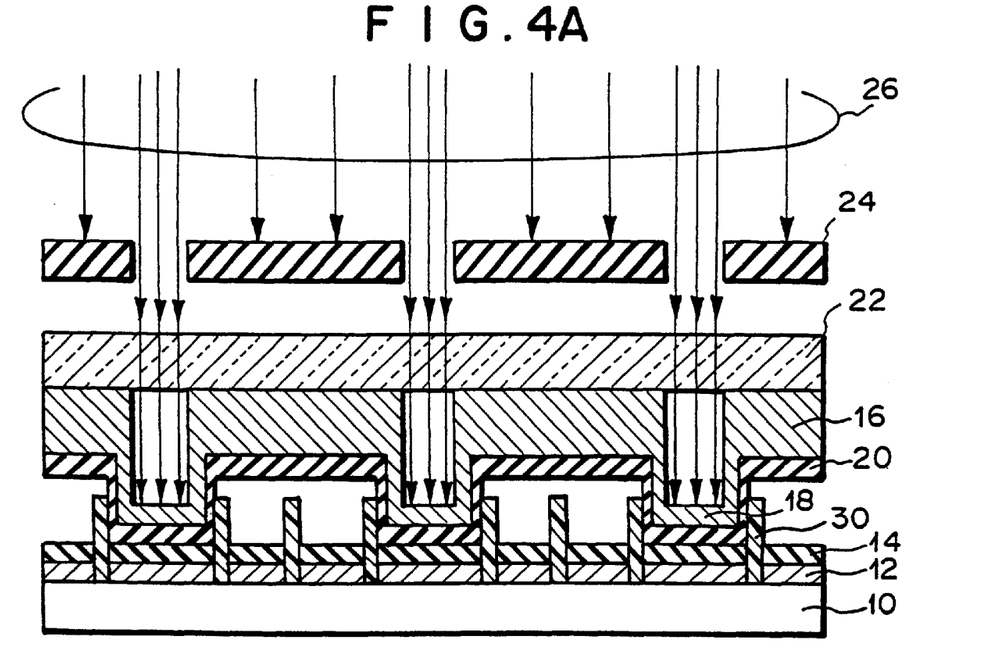
FIGS. 4A, 4B, and 4C are sectional views for explaining a fabrication method for a color organic EL display according to a third embodiment of the present invention.

An ITO film 12 is formed on a glass substrate 10. Thereafter, a pattern of the ITO film 12 is photo-lithographed and etched. As an insulation wall 30 whose width is 5 $\mu$m and whose height is 40 $\mu$m, an SiO$_2$ film is photo-lithographed and etched.

Next, as a positive hole transporting material, N, N'-diphenyl-N, N'-di(3-methylphenyl)-1,1'-biphenyl-4,4'-diamine is vacuum-evaporated for 50 nm. A positive hole transporting layer 14 is equally formed on the ITO film 12. The size of a protrusion portion 18 of a metal sheet 16 that is a transfer substrate corresponds to the size of a light emission device area disposed on a substrate 10 through an SiO$_2$ film. The size of the protrusion portion 18 of the metal sheet 16 is 80 $\mu$m×80 $\mu$m. The pitches of protrusion portions 18 are 30 $\mu$m. The height of each protrusion portion 18 is 50 $\mu$m. The inner thickness of each protrusion portion 18 is 10 $\mu$m. As a red light emission organic material, alumiquinoline complex and 4-dicyanomethylene-2-methyl-6-(p-dimethylaminostyryl)-4H-pyrane (DCM, doping concentration=5 wt %) as adopant are co-evaporated for 25 nm. As an electron transporting layer, alumiquinoline complex is evaporated for 35 nm.

Thereafter, the light emission device portion is aligned with the protrusion portion 18. A glass substrate 22 is placed on the metal sheet 16. Laser right with a wavelength of 1000 nm is radiated from a YAG laser source to the interior of the protrusion portion 18. Thus, the red light emission organic material sublimates and transfers to the positive hole transporting layer (see FIGS. 4A and 4B).

Figure 4B:
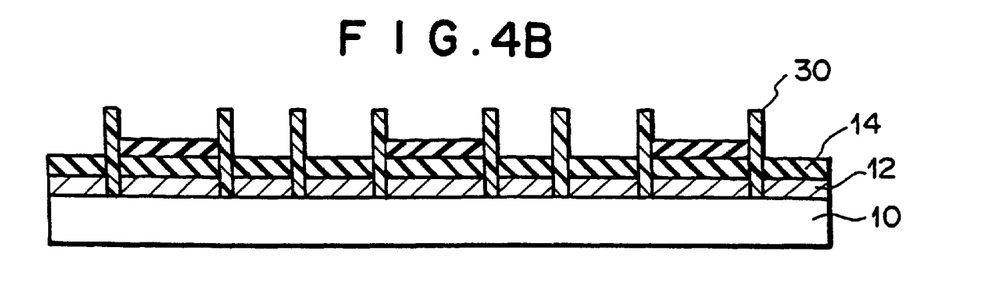

Next, as a green light emission organic material, tris (8-quinolinole) aluminum (alumiquinoline complex) as a host and quinacridone (doping concentration=5 wt %) as a dopant are co-evaporated evaporated for 25 nm on a protrusion portion 18 of a respective metal sheet 16. As an electron transporting layer, tris (8-quinolinole) aluminum is evaporated for 30 nm. In the same manner as the red light emission organic material, the green light emission organic material sublimates and transfers to a green light emission device area.

In addition, as a blue light emission organic material, perylene is evaporated for 25 nm on a protrusion portion 18 of a respective metal sheet 16. As an electron transporting layer, tris (8-quinolinole) aluminum is evaporated for 35 nm. In the same manner as the red light emission organic material, the blue light emission organic material sublimates and transfers to a blue light emission device area. Thus, an array of light emission devices of three colors is obtained.

Figure 4C:
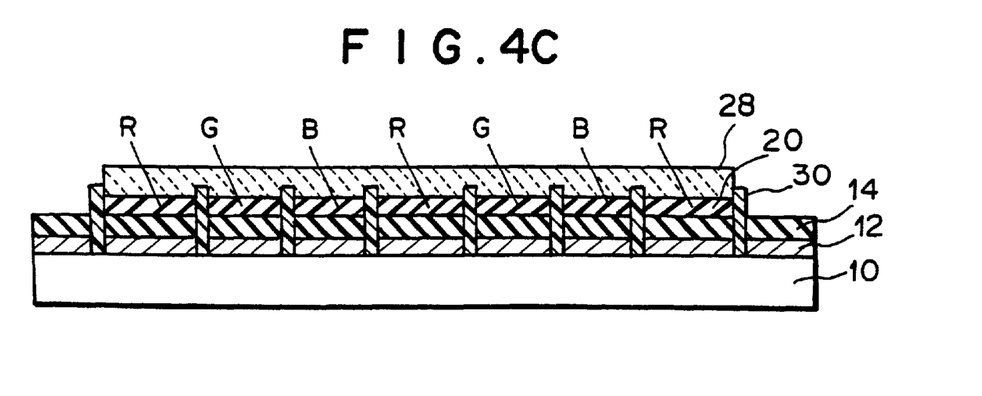

Next, as a cathode, Al:Li films 28 are co-evaporated for 30 nm so that they are perpendicular to the ITO film 12 and the light emission device areas. Thereafter, aluminum 28 is evaporated for 100 nm. Thus, a color organic EL display with a high device separation and a high contrast is obtained (see FIG. 4C).

In the third embodiment, when the sublimating and transferring steps are performed in air atmosphere, vacuum atmosphere, and inertia gas atmosphere, the same results of the present invention can be obtained.

[Fourth Embodiment]

Figure 5A:
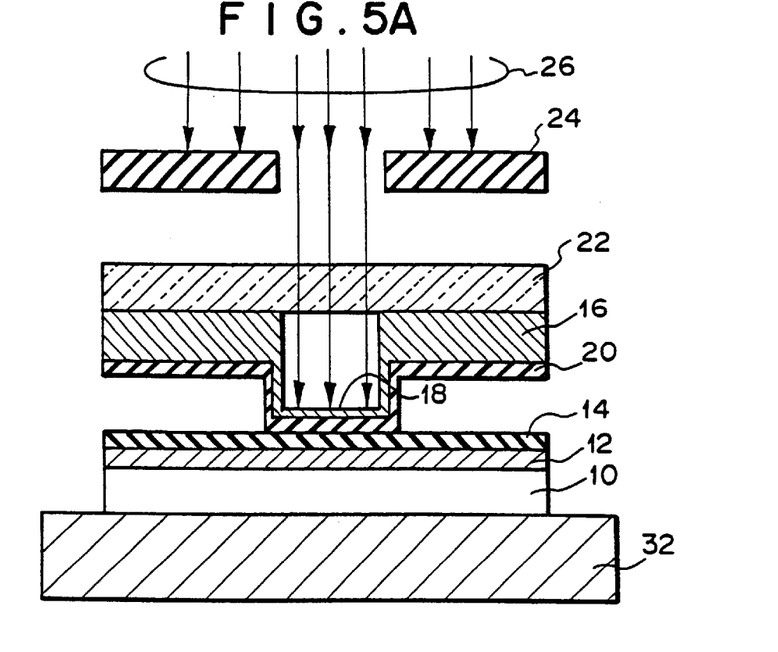
FIGS. 5A and 5B are sectional views for explaining a fabrication method for a color organic EL display according to a fourth embodiment of the present invention.
Figure 5B:
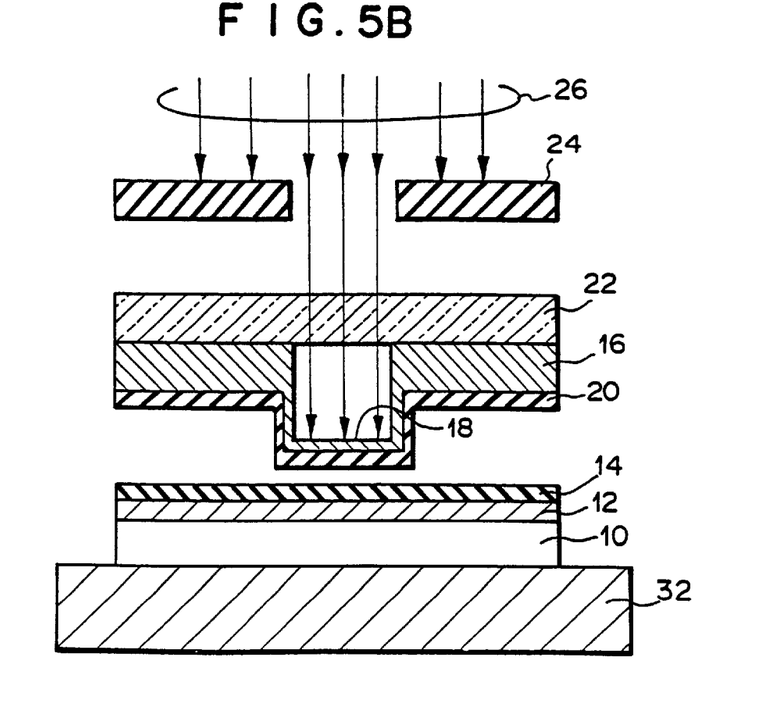

As a fourth embodiment of the present invention, while a substrate 10 is being cooled, the sublimating and transferring steps can be performed. Even if a protrusion portion 18 is slightly apart from a positive hole transporting layer 14, the effect of the present invention can be obtained (see FIGS.

5A and 5B). The material of a metal sheet 16 may be other than copper as long as the metal sheet 16 has high heat conductivity. The laser light may be generated by other than the YAG laser source. The sublimation means the state of which a substance vaporizes. In the sublimating and transferring steps, the distance between the light emission organic material and the light emission device area should be 100 μm or less in consideration of the splashing in the horizontal direction.

[Fifth Embodiment]

Figure 6:
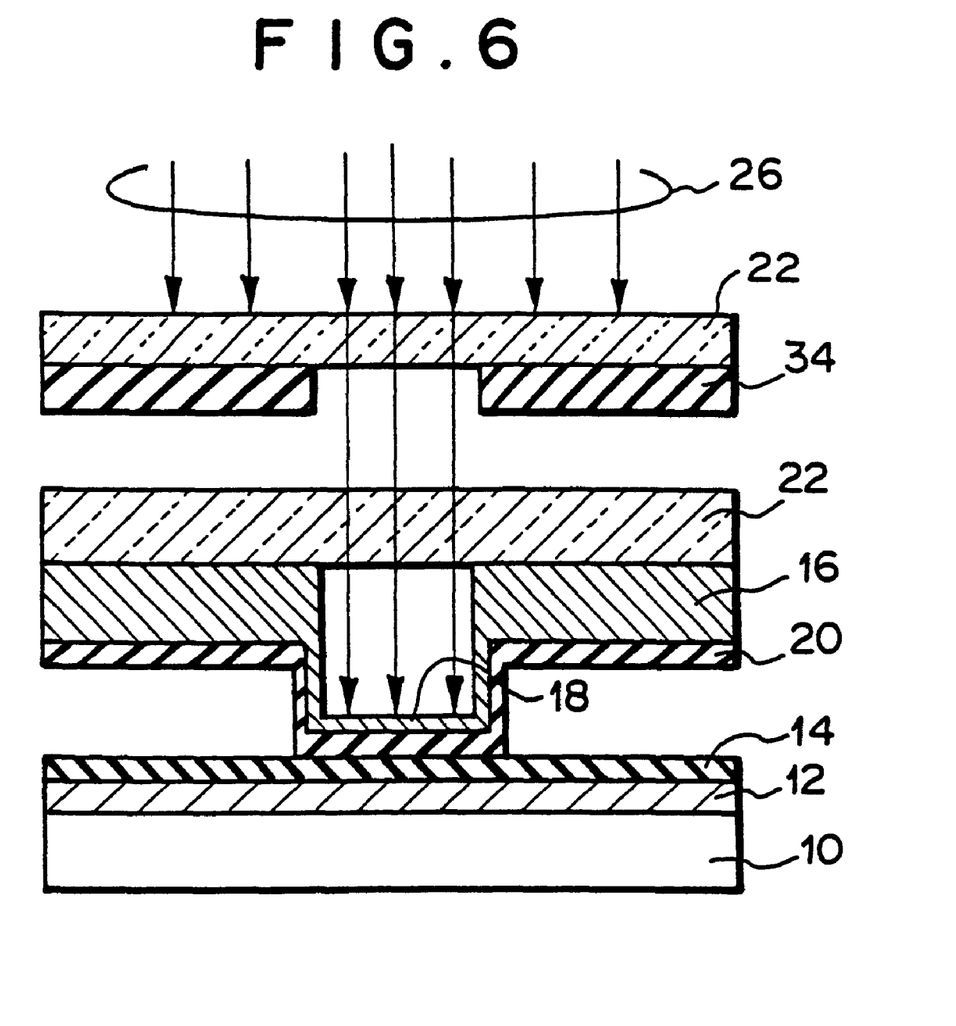
FIG. 6 is a sectional view for explaining a fabrication method for a color organic EL display according to a fifth embodiment of the present invention.

In a fifth embodiment of the present invention, as shown in FIG. 6, a shielding plate 34 may be evaporated or coated on a glass plate 22 that transmits laser light. The shielding plate 34 may be composed of a chrome film or a silicon film as a laser light absorbing film. The insulation wall 30 may be composed of photoresist or nitride. When the light emission device is elongated, the substrate 10 that is aligned with a metal sheet 16 can be moved in one direction or two directions.

[Sixth and Seventh Embodiments]

Figure 7A:
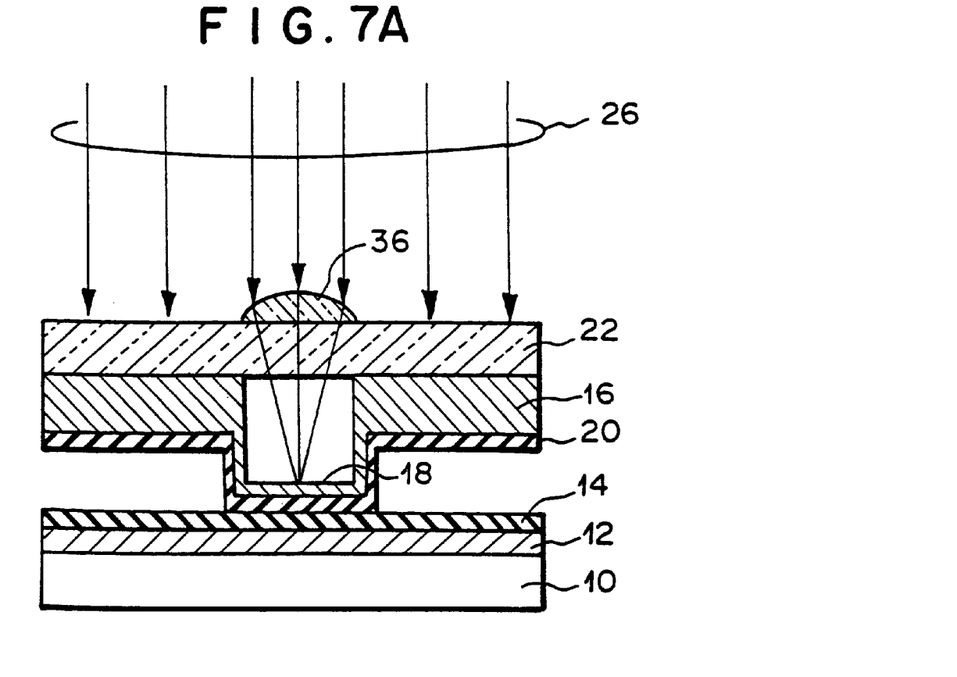
FIGS. 7A and 7B are sectional views for explaining a fabrication method for a color organic EL display according to a sixth embodiment of the present invention.
Figure 7B:
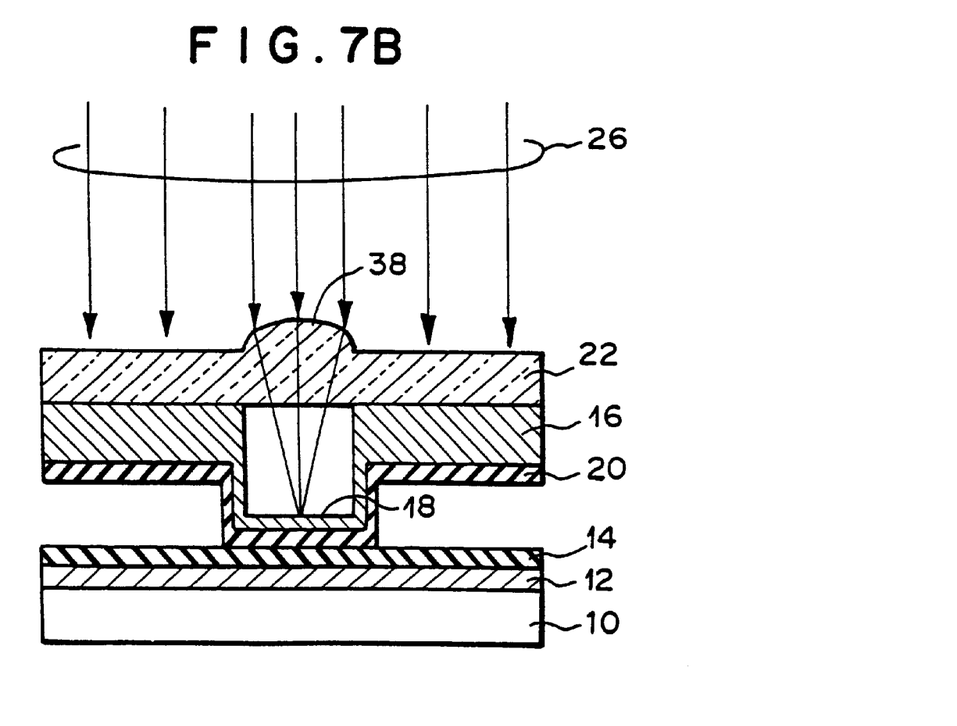
Figure 8A:
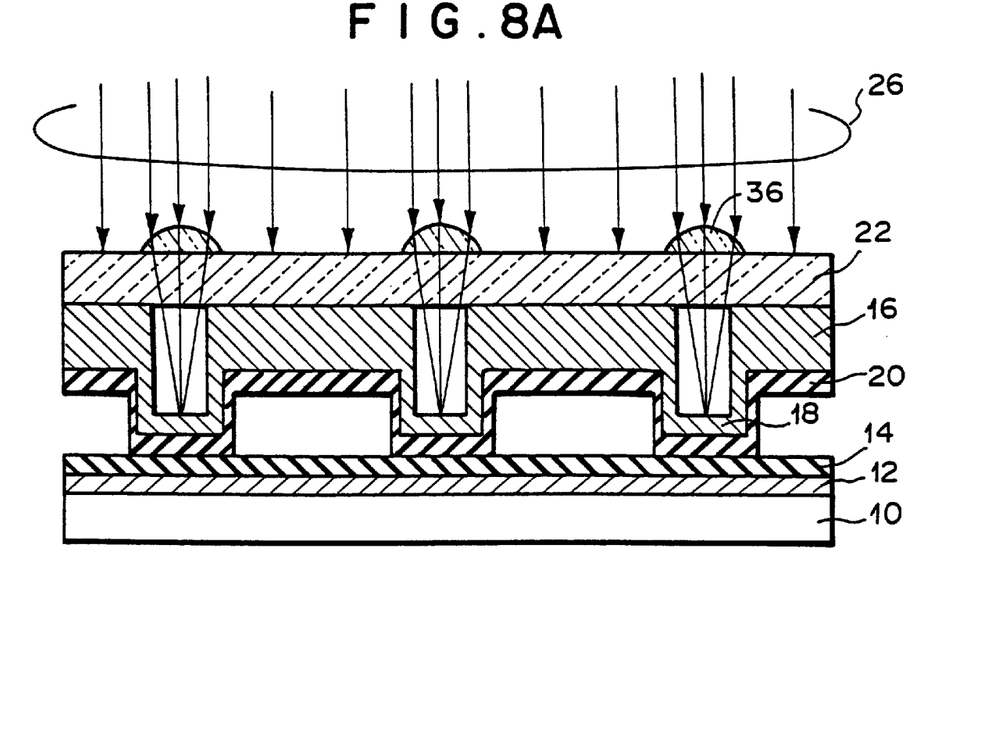
FIGS. 8A and 8B are sectional views for explaining a fabrication method for a color organic EL display according to a seventh embodiment of the present invention.
Figure 8B:
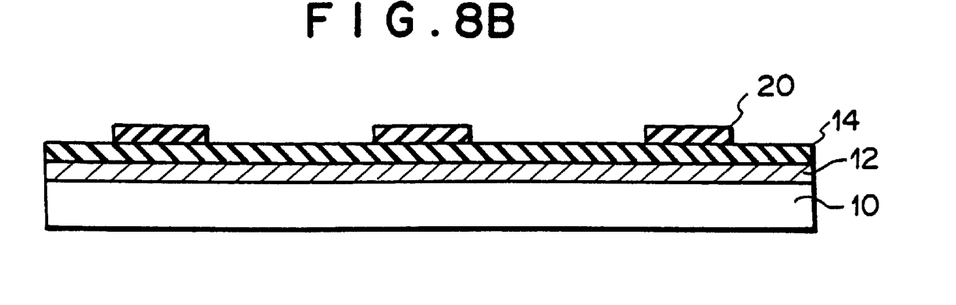

In the above-described embodiments, laser light may be focused on the opening portion that selectively transmits the laser light. Alternatively, an optical lens that beams laser light may be used. FIGS. 7A and 7B show the structure according to a sixth embodiment of the present invention. FIGS. 8A and 8B show the structure according to a seventh embodiment of the present invention.

In the sixth embodiment, a semi-sphere lens 36 is disposed on a glass plate 22 of a metal sheet 16 as shown in FIG. 7A. The semi-sphere lens 36 is composed of resin with high transparency. Alternatively, a glass plate 22 has a semi-sphere lens 38. Although laser light 26 is radiated to the entire surface of the glass plate 22, heat energy of light that passes through the lens is much stronger than that of light that does not passes through the lens. Thus, the positive hole transporting material outside the protrusion portion 18 does not sublimate (see FIGS. 7A and 7B).

Thus, according to the seventh embodiment, as shown in FIGS. 8A and 8B, a glass plate has a condenser lens function. In addition, a lens array which each light emission device area has a lens is structured. Consequently, in addition to the accomplishment of the object of the present invention, since a shielding plate is not required, as a side effect, the color display is not affected by the work accuracy of the shielding plate.

[Eighth and Ninth Embodiments]

Figure 9A:
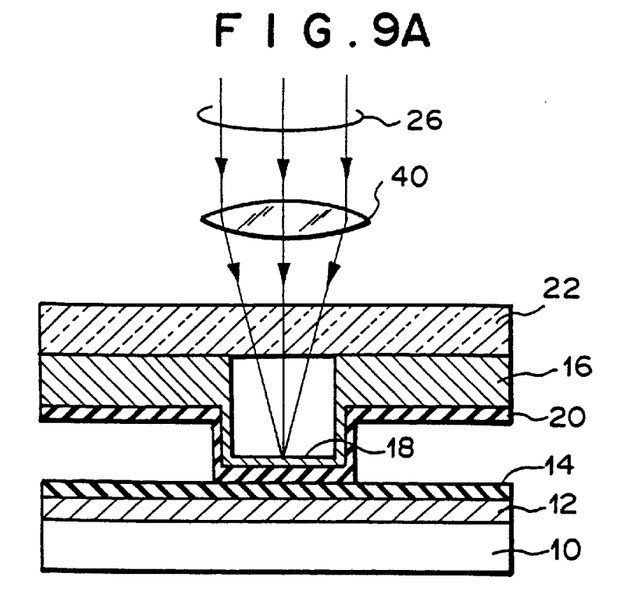
FIGS. 9A and 9B are sectional views for explaining a fabrication method for a color organic EL display according to an eighth embodiment of the present invention.
Figure 9B:
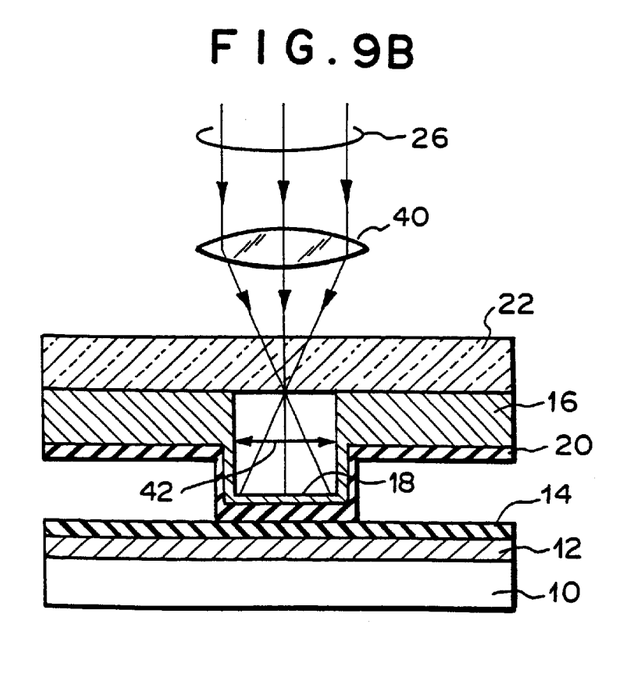

As an eighth embodiment of the present invention, the optical lens of the sixth embodiment and the seventh embodiment may be a convex lens whose focus can be freely varied (see FIGS. 9A and 9B). In this case, the shielding plate is not required. Laser light that is collimated light is beamed by a convex lens 40. The beamed light is radiated to an emboss protrusion portion 18. Thus, a metal sheet 10 heats and each light emission organic material 20 transfers to a hole transmitting layer 14. The size of the protrusion of the protrusion portion 18 represents the transfer area.

Figure 10A:
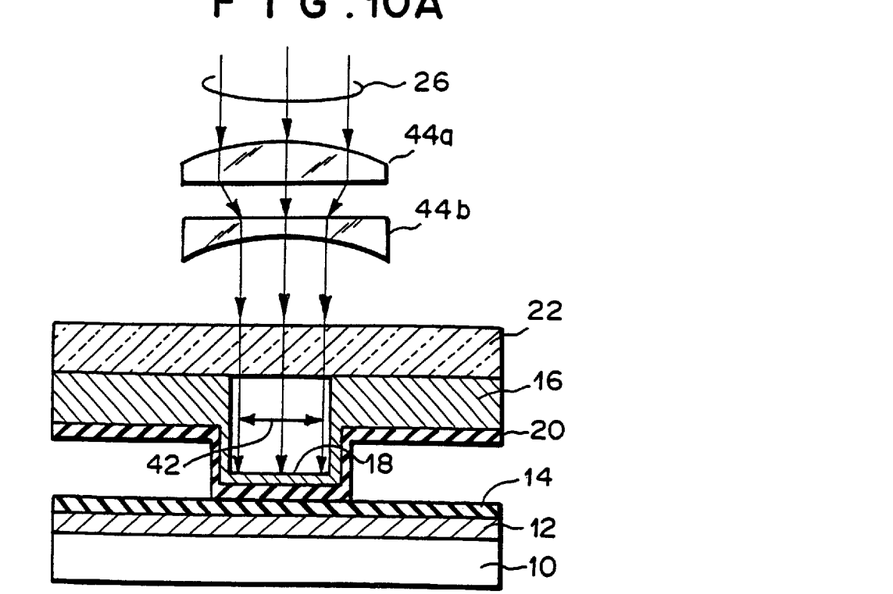
FIG. 10A is a sectional view for explaining a fabrication method for a color organic EL display according to a ninth embodiment of the present invention.
Figure 10B:
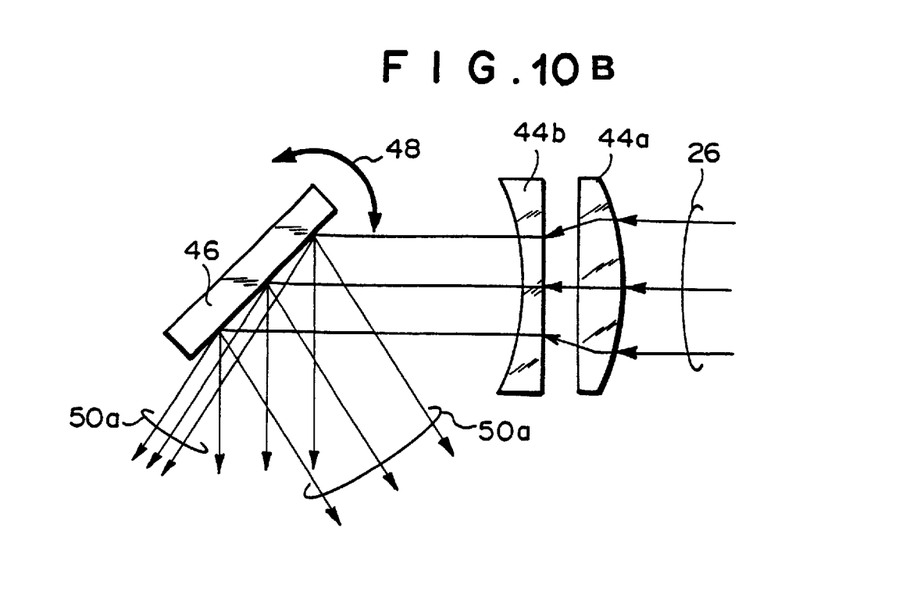
FIG. 10B is a schematic diagram showing the structure for changing an optical path.

Next, a ninth embodiment of the present invention will be described with reference to FIGS. 10A and 10B. In the ninth embodiment shown in FIGS. 10A and 10B, a plurality of lenses 44a and 44b are used. With the lenses 44a and 44b, laser light 26 is collimated corresponding to protrusion size 42 of the protrusion. In this case, since laser light 26 is radiated to the entire flat portion of the protrusion portion 18, the temperature of the transfer portion equally rises. Thus, in addition to the easiness of the transferring step, the temperature of the transfer portion quickly rises. Consequently, the transfer time can be reduced.

When the light emission device is elongated, laser light that has been condensed and beamed is radiated to a mirror 46. The mirror 46 is vibrated in the elongated direction by a vibrating mechanism 48 so that a light beam 50a is moved as shown in FIG. 10B. Thus, the laser light can be momentarily radiated to the elongated protrusion portion 18. Consequently, the light emission organic material can be successively transferred in the elongated direction. When the intensity of the laser light 26 is adjusted corresponding to the radiation angle of the mirror 46 by the vibrating mechanism 48, the temperature of the elongated protrusion portion 18 can be equally raised. The light emission organic material 20 of each color can be transferred to the respective positive hold transporting layer 14.

The present invention is a fabrication method for a color organic EL display having a pair of electrodes and an organic light emission material, at least one of the electrodes being transparent or semi-transparent, the electrodes being oppositely disposed, the method comprising the steps of (a) preparing a transfer substrate having a convex protrusion with high heat conductivity, the light emission organic material being evaporated as a layer on the convex protrusion, (b) clamping the transfer substrate to a positive hole transporting layer formed on a transparent conductive substrate or a transparent conductive film, and (c) heating the convex protrusion of the transfer substrate. In addition, according to the present invention, since a protrusion portion is heated with laser light, fine light emission device areas can be selectively heated. Thus, a color organic EL display with three colors of light emissions, high visual recognition characteristic, and high angle of view field.

Thus, a transfer substrate having a protrusion on which a light emission organic material is evaporated and that has high heat conductivity is disposed. The protrusion serves its duty on the light emission organic material to selectively sublimate and transfer to a light emission device area.

Thus, the color purity due to mutual contamination of three color light emission organic materials can be prevented from deteriorating.

While the front surface of a protrusion and the front surface of a positive hole transporting layer are being clamped, laser light as a heating source is radiated to the interior of the protrusion and thereby the light emission organic material on the front surface of the protrusion is heated. Thus, the light emission organic material sublimates and transfers to the front surface of the positive hole transporting layer.

Thus, since laser light is radiated to only the front surface of the protrusion, a temperature slope takes place between the radiated portion and the non-radiated portion. Thus, since the light emission organic material does not sublimate, it does not contaminate to other light emission devices. Consequently, the color purity improves.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A fabrication method for a color organic EL display having an organic light emission material as a layer, comprising the steps of:

(a) depositing a first electrode as a positive hole transporting layer on a glass substrate so as to form a first substrate;

(b) providing a metal sheet having a hollow protrusion portion with a flat edge and depositing an organic light emission material on said metal sheet and providing a glass plate on the metal sheet so as to form a second substrate;

(c) clamping the positive hole transporting layer of the first substrate to the organic light emission material of the second substrate with the glass plate; and (d) radiating laser light from the glass plate of the second substrate so as to raise a temperature of the hollow protrusion portion and transferring the organic light emission material to the first substrate.

2. The fabrication method as set forth in claim 1 further comprising the step of:

depositing a metal alloy on the first substrate so as to form a second electrode.

3. The fabrication method as set forth in claim 2 wherein step (d) is performed for each of colors of the light emission organic material.

4. The fabrication method as set forth in claim 2 wherein step (d) is performed by radiating laser light to a front surface of the glass plate of the second substrate through a shielding plate having a hole of a same size as the protrusion portion, and wherein a convex lens is disposed between the shielding plate and the protrusion portion.

5. The fabrication method as set forth in claim 1 wherein step (d) is performed by radiating laser light to a front surface of the glass plate of the second substrate through a shielding plate having a hole for passing the radiating laser light therethrough and being of a same size as a hollow part of the protrusion portion so as to raise the temperature of the light emission organic material formed on the protrusion portion, and transferring the light emission organic material to the first substrate.

6. The fabrication method as set forth in claim 1 wherein step (d) is performed for each of colors of the light emission organic material.

7. The fabrication method as set forth in claim 1 wherein step (d) is performed by radiating laser light to a front surface of the glass plate of the second substrate through a shielding plate having a hole of a same size as the protrusion portion, and wherein a convex lens is disposed between the shielding plate and the protrusion portion.

8. The fabrication method as set forth in claim 1 wherein step (d) is performed with a convex lens that focuses laser light to the protrusion portion, the convex lens being disposed above the glass plate of the second substrate.

* * * * *